US009529065B2

(12) United States Patent
Wang et al.

(10) Patent No.: US 9,529,065 B2
(45) Date of Patent: Dec. 27, 2016

(54) INTERLEAVED BLACK AND BRIGHT BLOOD DYNAMIC CONTRAST ENHANCED (DCE) MRI

(75) Inventors: Jinnan Wang, Seattle, WA (US); Huijun Chen, Seattle, WA (US); Peter Börnert, Hamburg (DE); Chun Yuan, Bellevue, WA (US)

(73) Assignees: Koninklijke Philips N.V., Eindhoven (NL); University of Washington, Seattle, WA (US)

( * ) Notice: Subject to any disclaimer, the term of this patent is extended or adjusted under 35 U.S.C. 154(b) by 575 days.

(21) Appl. No.: 14/112,135

(22) PCT Filed: Apr. 12, 2012

(86) PCT No.: PCT/IB2012/051779
§ 371 (c)(1),
(2), (4) Date: Oct. 16, 2013

(87) PCT Pub. No.: WO2012/143824
PCT Pub. Date: Oct. 26, 2012

(65) Prior Publication Data
US 2014/0035581 A1 Feb. 6, 2014

Related U.S. Application Data

(60) Provisional application No. 61/477,854, filed on Apr. 21, 2011.

(51) Int. Cl.
*G01V 3/00* (2006.01)
*G01R 33/48* (2006.01)
*G01R 33/563* (2006.01)

(52) U.S. Cl.
CPC ........... *G01R 33/48* (2013.01); *G01R 33/5635* (2013.01); *G01R 33/56316* (2013.01)

(58) Field of Classification Search
CPC ... G01R 33/48; G01R 33/30; G01R 33/56316; G01R 33/5635
(Continued)

(56) References Cited

U.S. PATENT DOCUMENTS

2003/0062893 A1   4/2003   Overall
2008/0119721 A1   5/2008   Kimura
(Continued)

FOREIGN PATENT DOCUMENTS

JP        04220236 A   *   8/1992

OTHER PUBLICATIONS

"Pre-pulse Sequence for Black Blood Magnetic Resonance Angiography", Jul. 10, 2000, Research Disclosure, RN435022.*
(Continued)

*Primary Examiner* — Susan Lee

(57) ABSTRACT

Interleaved black/bright imaging (IBBI) is performed using a magnetic resonance (MR) scanner wherein the black blood module of the IBBI includes: applying a first flow sensitization gradient; applying a spoiler gradient after applying the first flow sensitization gradient; applying a second flow sensitization gradient after applying the spoiler gradient wherein the second flow sensitization gradient has area equal to the first flow sensitization gradient but of opposite polarity; applying a slice selective radio frequency excitation pulse after applying the spoiler gradient; and performing a MR readout after applying the second flow sensitization gradient and after applying the slice selective radio frequency excitation wherein the readout acquires MR imaging data having blood signal suppression in the region excited by the slice selective radio frequency excitation pulse. The MR imaging data having blood signal suppression is reconstructed to generate black blood images, and
(Continued)

MR imaging data generated by bright blood modules of the IBBI is reconstructed to generate bright blood images.

12 Claims, 7 Drawing Sheets

(58) Field of Classification Search
USPC .......................................................... 324/309
See application file for complete search history.

(56) References Cited

U.S. PATENT DOCUMENTS

2009/0261825 A1* 10/2009 Duerk ................ G01R 33/5614
324/307
2011/0181283 A1    7/2011  Grinstead

OTHER PUBLICATIONS

Tan, Ek T. et al "Fast Inversion Recovery Magnetic Resonance Angiography of the Intracranial Arteries", Magnetic Resonance in Medicine, vol. 63, No. 6, Apr. 2010, pp. 1648-1650.

Miyazaki, Mitsue et al "Non-Contrast-Enhanced MR Angiography of the Abdomen", European Journal of Radiology, vol. 80, No. 1, Dec. 2010, pp. 9-23.

Wang, J. et al "Interleaved Local Excited Black Blook (LOBBI) and Bright Blood MRI for Improved Vessel Wall DCD", Proceedings of the International Society for Magnetic Resonance in Medicine, vol. 19, Apr. 23, 2011, p. 1234.

Abd-Elmoniem, Khaled et al, "107 Small Field of View Black-Blood Imaging of the Human Heart using Local Excitation", Journcel of Cardiovascular Magnetic Resonance, Biomed Central Ltd, vol. 10, No. Suppl. 1, Oct. 22, 2008.

Yarnykh, Vasily L. et al "Simultaneous Outer Volume and Blood Suppression by Quadruple Inversion-Recovery", Magnetic Resonance in Medicine, vol. 55, No. 5, Jan. 2006, pp. 1083-1092.

Bornstedt, Axel et al "Local Excitation Black Blood Imaging at 3T: Application to the Carotid Artery Wall", Magnetic Resonance in Medicine, vol. 59, No. 5, Jan. 2008, pp. 1207-1211.

Wang, J. et al "Local Excitation Black Blood Imaging (LOBBI) for Local Transmission Coil at High Field MRI (7T and Above)", Proceedings of the International Society for Magnetic Resonance in Medicine, vol. 19, Apr. 2011, p. 1239.

Contreras, S. et al "Black and Bright-Blood Sequences Magnetic Resonance Angiography and Gross Sections of the Canine Thorax: An Anatomical Study", Veterinary Journal, vol. 185, No. 2, Aug. 2010, pp. 231-234.

Jeudy, J. et al "Cardiac Magnetic Resonance Imaging: Techniques and Principles" Seminars in Roentgenology, vol. 43, No. 3, Jul. 2008.

Mattle, H.P. et al "Evaluation of the Extracranial Carotid Arteries: Correlation of Magnetic Resonance Angiography, Duplex Ultrasonography, and Conventional Angiography", Journal of Vascular Surgery, vol. 13, No. 6, Jan. 1991, pp. 838-845.

Hinton, D.P. et al Bright and Black Blood Imaging of the Carotid Bifurcation at 3.0T, European Journal of Radiology, vol. 57, No. 3, Mar. 2006, pp. 403-411.

* cited by examiner

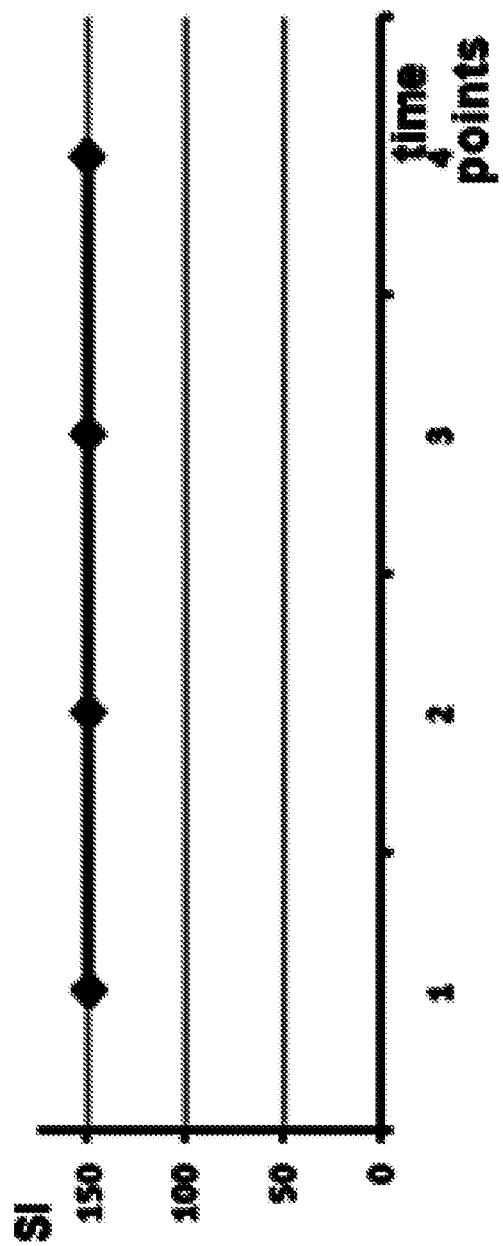

INTERLEAVED BLACK AND BRIGHT BLOOD DYNAMIC CONTRAST ENHANCED (DCE) MRI

CROSS-REFERENCE TO PRIOR APPLICATIONS

This application is the U.S. National Phase application under 35 U.S.C. §371 of International Application No. PCT/IB2012/051779, filed on Apr. 12, 2012, which claims the benefit of U.S. Provisional Patent Application No. 61/477,854, filed on Apr. 21, 2011. These applications are hereby incorporated by reference herein.

This application claims the benefit of U.S. Provisional Application No. 60/477,854 filed Apr. 21, 2011 and titled "Interleaved black and bright blood dynamic contrast enhanced (DCE) Magnetic Resonance Imaging using Local excitation Black Blood Imaging (LOBBI)".

The following relates to the magnetic resonance arts, magnetic resonance imaging arts, magnetic resonance angiography arts, and to applications thereof such as medical imaging, veterinary imaging, and so forth.

Dynamic contrast enhanced (DCE) magnetic resonance imaging (MRI) has been used to quantify inflammatory features of the atherosclerotic plaque. It is however still challenging to evaluate inflammation in early lesion and the fibrous cap region (for plaque rupture) due to the difficulties of acquiring both the bright blood arterial input function (AIF) and tissue signal variations (black blood) in a small region near the lumen.

Some approaches compromise by acquiring only bright-blood images, or only black-blood images. A more desirable approach is to acquire bright blood images and black blood images in an interleaved fashion, so that the requirements of high temporal resolution for the AIF and the high spatial resolution for the vessel wall imaging can be achieved at the same time. However, achieving high quality interleaved black/bright imaging (IBBI) has heretofore been difficult because the black blood imaging pulses employ spatially non-selective radio frequency (RF) pulses that tend to interfere with the bright blood imaging module, leading to inaccurate AIF quantification.

The following contemplates improved apparatuses and methods that overcome the aforementioned limitations and others.

According to one aspect, a method comprises: performing a plurality of repetitions of a local excitation black blood imaging (LOBBI) sequence using a magnetic resonance scanner; and, between successive repetitions of performing the LOBBI sequence, performing at least one interposed repetition of a bright blood angiography sequence using the magnetic resonance scanner. Magnetic resonance imaging data generated by the performing of the plurality of repetitions of the LOBBI sequence are suitably reconstructed to generate a corresponding plurality of black blood images, and magnetic resonance imaging data generated by the interposed repetitions of a bright blood angiography sequence are reconstructed to generate corresponding bright blood images.

According to another aspect, a method comprises performing interleaved black/bright imaging (IBBI) using a magnetic resonance scanner wherein the black blood module of the IBBI includes: applying a first flow sensitization gradient; applying a spoiler gradient after applying the first flow sensitization gradient; applying a second flow sensitization gradient after applying the spoiler gradient wherein the second flow sensitization gradient has area equal to the first flow sensitization gradient but of opposite polarity; applying a slice selective radio frequency excitation pulse after applying the spoiler gradient; and performing a magnetic resonance readout after applying the second flow sensitization gradient and after applying the slice selective radio frequency excitation wherein the readout acquires magnetic resonance imaging data having blood signal suppression in the region excited by the slice selective radio frequency excitation pulse. The magnetic resonance imaging data having blood signal suppression in the region excited by the slice selective radio frequency excitation pulse may be reconstructed to generate black blood images, and magnetic resonance imaging data generated by bright blood modules of the IBBI may be reconstructed to generate bright blood images.

According to another aspect, a non-transitory storage medium stores instructions executable by an electronic data processing device operating in conjunction with a magnetic resonance scanner controlled by the electronic data processing device to perform a method as set forth in either one of the two immediately preceding paragraphs. According to another aspect, an apparatus comprises a magnetic resonance scanner and an electronic data processing device programmed to perform a method as set forth in either one of the two immediately preceding paragraphs.

One advantage resides in providing interleaved black/bright imaging (IBBI) in which interference of the bright blood module by the black blood module is reduced.

Another advantage resides in providing arterial input function (AIF) measurements with improved accuracy while maintaining high temporal resolution for dynamic contrast enhanced (DCE) Magnetic Resonance Imaging (MRI).

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance angiography system employing local excitation black blood imaging (LOBBI) as the black blood module in interleaved black/bright imaging (IBBI).

FIGS. 2-4 diagrammatically show some suitable LOBBI pulse sequences.

FIG. 5 diagrammatically shows a block diagram of an interleaved black/bright imaging (IBBI) sequence.

FIG. 6 diagrammatically shows a block diagram of an IBBI sequence employing a LOBBI black blood sequence as the black blood modules.

Figure 8:
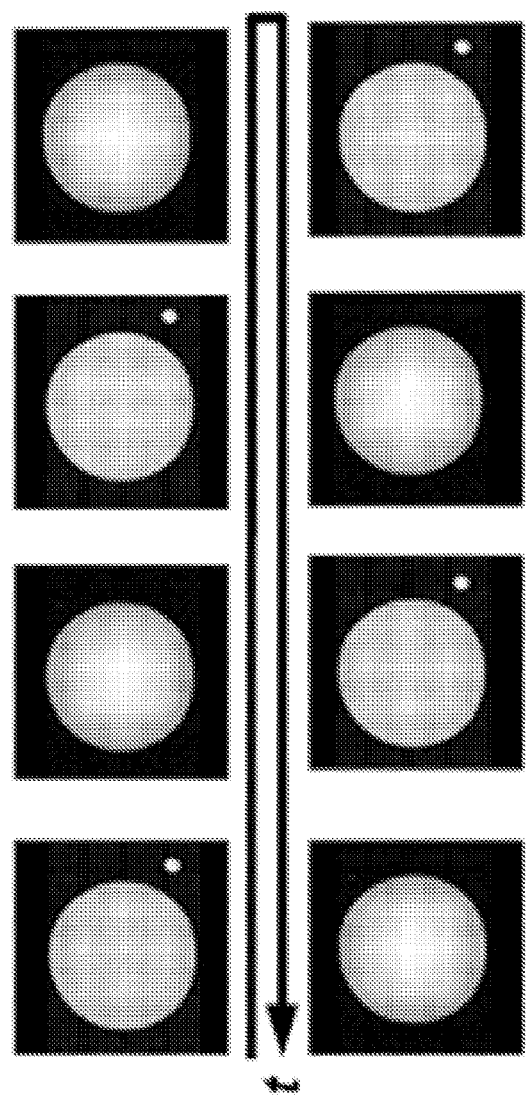
FIG. 8 shows IBBI imaging experiments employing LOBBI black blood modules performed on the flow phantom of FIG. 7.

FIG. 9 plots signal intensity (SI) of the bright blood images of FIG. 8.

Disclosed herein is a black blood technique referred to herein as LOcal excitation Black Blood Imaging (LOBBI), which is capable of achieving effective blood suppression even if the RF pulses are applied in a local region. As further disclosed herein, by using LOBBI as the black blood module in interleaved black/bright imaging (IBBI), interference of the bright blood module by the black blood module is effectively overcome. This approach achieves sufficient blood suppression in a local region, avoids signal interference with the flowing bright blood images so as to allow accurate AIF measurement, and maintains high temporal resolution for DCE MRI. The LOBBI technique does not require global radio frequency (RF) excitation, and allows for effective black blood imaging when local excitation Transmit/Receive (T/R) coil is used, providing black blood contrast for both blood originating from inside and outside of the imaging plane/slab.

Figure 1:
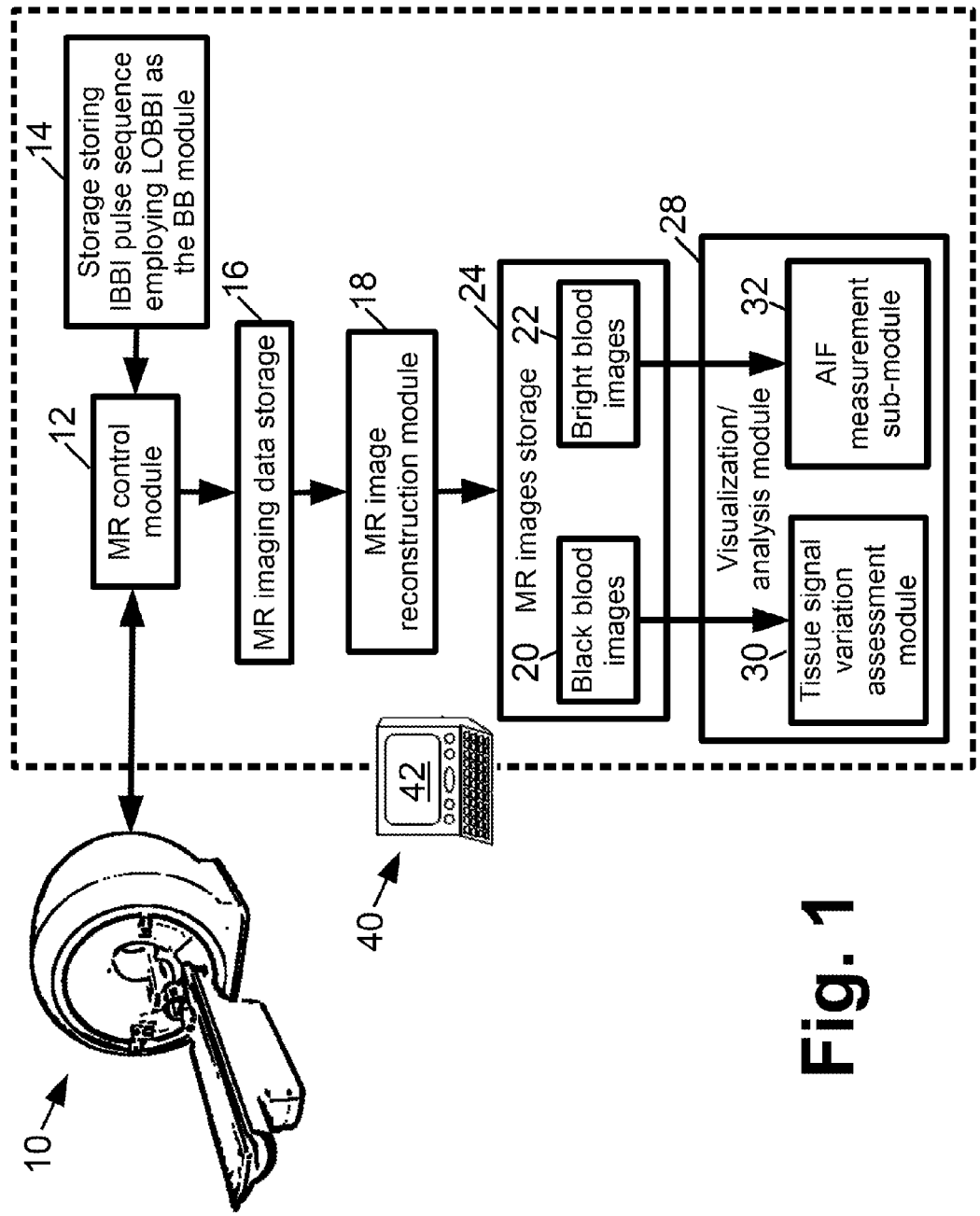

With reference to FIG. 1, an illustrative magnetic resonance angiography (MRA) system is described, which employs local excitation black blood imaging (LOBBI) as the black blood module in interleaved black/bright imaging (IBBI). The MRA system includes an MR scanner 10 operated by a magnetic resonance (MR) control module 12 to retrieve from a sequences storage 14 an IBBI sequence that employs a LOBBI sequence as the black blood module, and to execute the retrieved LOBBI sequence to perform black blood imaging of a subject (for example, a human subject, a veterinary subject, a clinical or pre-clinical test subject, or so forth). The MRI scanner 10 can be any type of commercial or non-commercial MRI scanner, such as (by way of illustrative example) an Achieva™, Ingenia™, Intera™, or Panorama™ MRI scanner (available from Koninklijke Philips Electronics N.V., Eindhoven, The Netherlands). The performed sequence generates MR imaging data for a sequence of black blood and bright blood images that are suitably stored in an MR imaging data storage 16. An MR image reconstruction module 18 applies a suitable image reconstruction algorithm to the MR imaging data generated by the LOBBI sequence module to generate one or more MR images 20 having black blood contrast (that is, one or more black blood MRA images 20). The reconstruction module 18 also applies a suitable image reconstruction algorithm to the MR imaging data generated by the bright blood sequence module of the IBBI sequence (which may, for example, be a time-of-flight bright blood imaging module) to generate one or more MR images 22 having bright blood contrast (that is, one or more bright blood MRA images 22). The black and bright blood images 20, 22 are suitably stored in an MR images storage 24. The choice of image reconstruction algorithm depends upon the spatial encoding employed in the imaging data acquisition and may, for example, be a Fourier transform-based image reconstruction algorithm.

An image visualization/analysis module 28 performs display and/or analysis of the black and bright blood images 20, 22. In an illustrative application, inflammatory features of atherosclerotic plaque are quantified to evaluate inflammation in early lesion and the fibrous cap region (for plaque rupture). Toward this end, a tissue signal variation assessment module 30 processes the black blood images 20 to assess or quantify tissue signal variations in a region proximate to the lumen, while an arterial input function (AIF) measurement sub-module 32 processes the bright blood images 22 to assess or quantify the AIF. As is known in the art, black blood images provide more accurate lumen definition compared with time-of-flight (TOF) based bright-blood MRA because TOF may be affected by blood velocity reduction proximate to blood vessel walls. On the other hand, bright blood images contain content for computing AIF.

The data processing and control components 12, 18, 28, 30, 32 are suitably implemented by an electronic data processing device 40, such as a suitably programmed illustrative computer 40, a network based server, or so forth, that includes or has operative access to a display device 42 via which the visualization module 28 displays images and/or image analysis results. In some embodiments analog or mixed circuitry may also be included, e.g. parallel reconstruction pipeline hardware optionally used in the image reconstruction module 18. The MR control module 12 is optionally implemented as a separate dedicated MR control computer. The image visualization module 28 may be implemented as a dedicated image processing workstation with a high resolution display.

The disclosed MRA imaging techniques employing IBBI using the LOBBI sequence as the black blood module can also be embodied as a non-transitory storage medium (not shown) such as a hard disk or other magnetic storage medium, optical disk or other optical storage medium, random access memory (RAM), flash memory or other electronic storage medium, or so forth, which stores instructions that are executable by the electronic data processing device 30 to perform the disclosed techniques.

Figure 2:
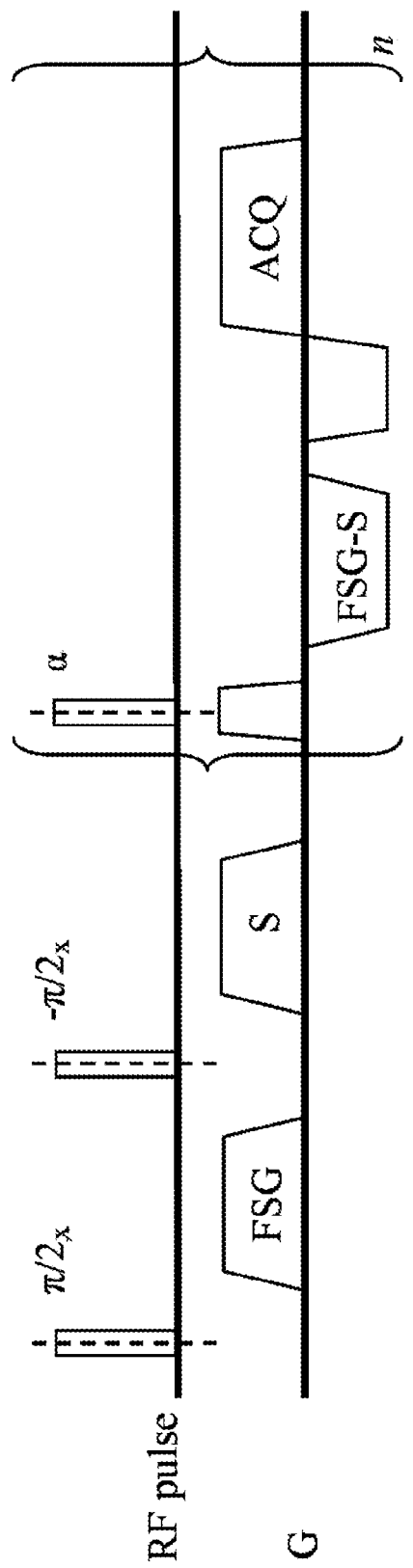

With reference to FIG. 2, an illustrative pulse diagram of a LOBBI sequence is shown. The following symbols are used in FIG. 2: the top plot labeled "RF pulse" diagrammatically shows applied radio frequency pulses; the bottom plot labeled "G" diagrammatically shows applied magnetic field gradients; the FSG gradient is a flow sensitization gradient for in-plane/slab flow sensitization; S is a spoiler gradient; the FSG-S gradient works as a rephrasing gradient for in-plane tissue/blood and a spoiler for blood originates from outside; ACQ is the acquisition gradients. The FSG-S gradient and the negative lobe of the ACQ gradient are shown as separate gradient pulses, but are optionally combined. The portion of the plots of FIG. 2 shown in braces $\{\ldots\}_n$ is an acquisition module (ACQ module) that can be repeated n times where n≥1.

The pulse diagram of the LOBBI sequence shown in FIG. 2 suppresses blood signal originated from both in-plane and out-of-plane, and operates as follows.

For blood that originates from inside the plane, these blood particles experience both the FSG and FSG-S gradients. The phase encoding status of the spins will be stored after the tip-up 90° pulse. The combination of both gradients (bi-polar) sensitizes the moving particles and destroys the phase coherences, as in the motion-sensitized driven-equilibrium (MSDE) black blood sequence, resulting in blood suppression.

For the static tissue (e.g., vessel wall) in the plane, the MR signal coming from these tissues will remain unsuppressed because their phase will be fully refocused by the bi-polar gradients.

For blood originating from outside of the plane, the blood particles experience only the FSG-S gradient, which will then operate as a spoiler gradient and suppress all the blood excited by the • pulse. This will eliminate the in-flow effect which would otherwise cause blood flow artifacts.

To avoid in-flow effect between the • pulses and the ACQ gradients, the time gap between the two is preferably made as short as possible. For example, in a typical carotid artery imaging application, the time gap between the two is suitably around 10 ms. For this 10 ms time gap and considering an illustrative blood velocity of 33 cm/s, only the peripheral 3 mm region around the coil sensitivity area will be affected by the in-flow effect. This is a significant improvement over the illustrative short MSDE sequence for multi-slice turbo field echo (TFE) black blood imaging using a local excitation coil, for which it is estimated that a 67 mm region will contain artifacts.

The LOBBI sequence can achieve black blood imaging with only local excitation, and so slice-selective RF pulses are optionally used. However, non-selective RF pulses achieve a larger black blood effect region.

Figure 3:
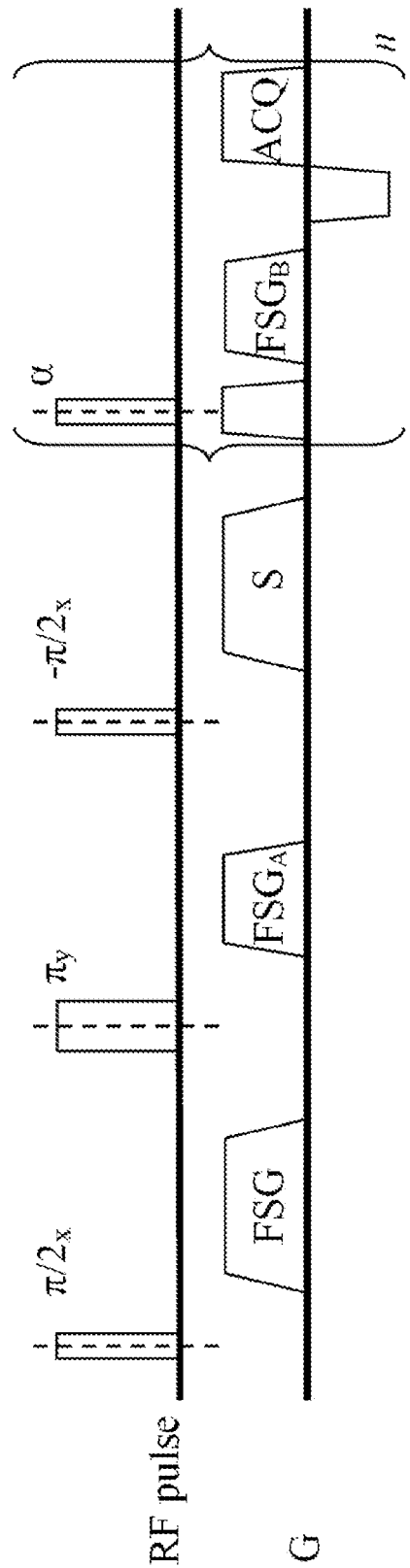

With reference to FIG. 3, another suitable LOBBI pulse sequence is shown. The pulse sequence of FIG. 3 is a spin echo embodiment of the LOBBI sequence. In this embodiment a 180° pulse is optionally added in the LOBBI prepulse to correct for signal drop caused by the B0 field inhomogeneity (known as the "T2* effect"). Said another way, the 180° pulse corrects for the T2* decay which would otherwise cause undesired signal drop. In the sequence of FIG. 3, the time gap between the three RF pulses should be the same.

In the LOBBI sequence shown in FIG. 3, the FSG-S gradient (see FIG. 2) is optionally split into two or more gradients, namely gradients $FSG_A$ and $FSG_B$ shown in FIG. 3. The area of both gradients $FSG_A$ and $FSG_B$ should be the same as that of the original FSG-S gradient (see FIG. 2), and also the same as gradient FSG. The optional split of the gradient FSG-S into smaller component gradients allows for a smaller gradient ($FSG_B$ in the embodiment of FIG. 3) to be used in the ACQ module (which in FIG. 3 is again marked off by braces $\{\ldots\}_n$ and is suitably repeated n times where n≥1), which will shorten the duration between the • pulse and the ACQ gradient, consequently reducing the flow artifacts caused by in-flow.

Figure 4:
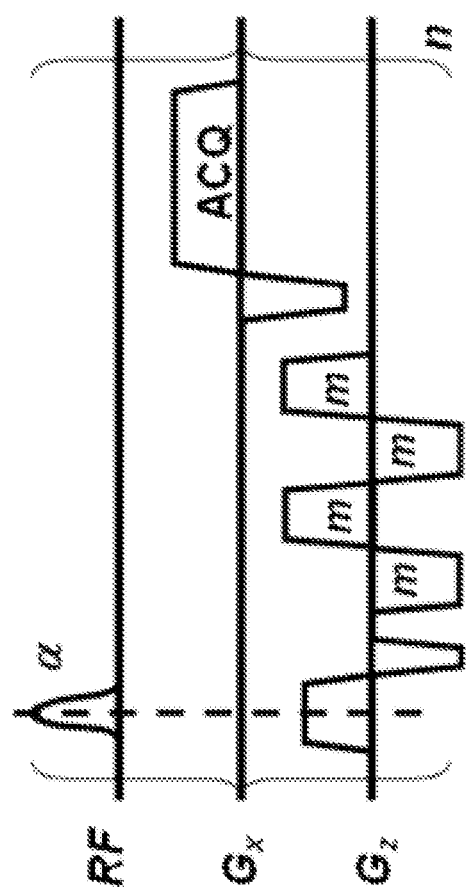

With reference to FIG. 4, a LOBBI sequence for local black blood suppression is shown. Unlike the traditional double-inversion-recovery (DIR) or motion-sensitized driven-equilibrium (MSDE) sequences, the LOBBI sequence does not rely on the global blood nulling to overcome the inflow effect. Rather, the LOBBI sequence only suppresses blood after the signal is excited by the RF pulse. Blood outside of the field of view (FOV) is left intact, preventing the following any interference with the bright blood images.

As disclosed herein, the LOBBI black blood imaging technique is suitably employed as the black blood module for interleaved black/bright imaging (IBBI). By using LOBBI as the black blood module in interleaved black/bright imaging (IBBI), interference of the bright blood module by the black blood module is effectively overcome.

Figure 5:
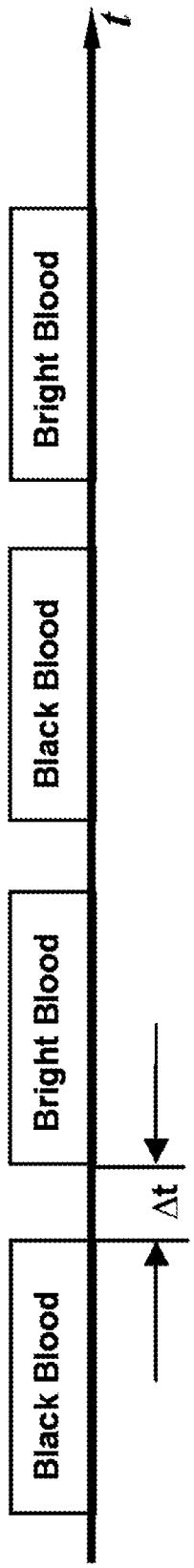

With reference to FIG. 5, achieving high quality IBBI has been difficult using existing black blood imaging techniques because the black blood imaging pulses employ spatially non-selective RF pulses that tend to interfere with the bright blood imaging module, leading to inaccurate AIF quantification. For example, the typical time gap Δt between the black blood preparation module and the following bright blood module (see FIG. 5) is usually less than 200 ms, which is not long enough for the blood to return to its equilibrium state (well over 1000 ms at 3 T).

In the IBBI dynamic contrast enhanced (DCE) MRI approach, the black blood and bright blood modules should be placed as close as possible to improve the temporal efficiency. A problem with this is that existing black blood imaging techniques rely upon spatially non-selective RF pulses for sufficient blood suppression. This is because using spatially selective pulses in existing black blood techniques would fail to suppress signal from blood flowing into the slice from outside. However, the spatially non-selective RF pulses of the black blood modules produces a residual black blood effect that tends to interfere with the following bright blood images.

One possible solution is to utilize spatially selective RF pulses for the black blood imaging, so as to reduce signal interference between the black and bright blood images. Spatially selective RF pulses, however, will likely lead to insufficient black blood suppression due to the inflow effect (that is, due to unsuppressed blood flowing into the slice).

The LOBBI black blood technique disclosed herein is capable of achieving effective blood suppression even if the RF pulses are applied in a local region. Thus, using a LOBBI sequence as the black blood module in IBBI achieves sufficient blood suppression in a local region while avoiding signal interference with the flowing bright blood images so as to allow accurate AIF measurement, and maintains high temporal resolution for DCE MRI.

Figure 6:
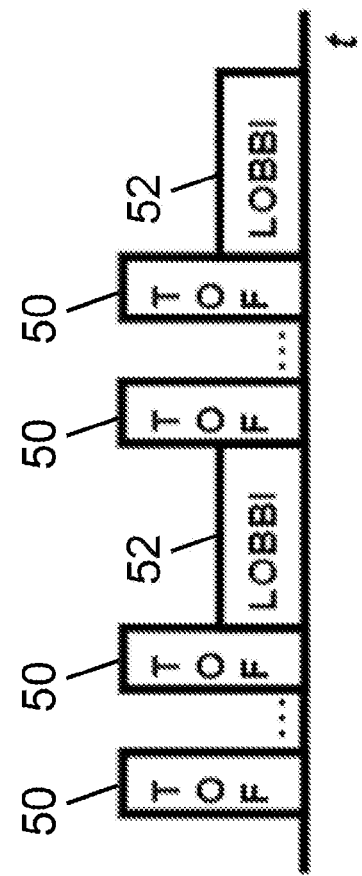

With reference to FIG. 6, an IBBI sequence employing LOBBI as the black blood module providing localized black blood suppression is diagrammatically shown. In the illustrative IBBI sequence of FIG. 6, time-of-flight (TOF) sequences 50 (i.e., bright blood modules 50) are used to achieve bright blood contrast, while LOBBI sequences 52 (i.e., LOBBI black blood modules 52) are used to achieve black blood contrast. Multiple TOF modules 50 can be placed between LOBBI modules 52 to improve the temporal resolution of the AIF acquisition. Another advantage of the disclosed IBBI sequences employing LOBBI black blood modules 52 is that coverage and location of the TOF and LOBBI sequences 50, 52 can be optimized separately depending on requirements for quantification of DCE analysis.

Figure 7:
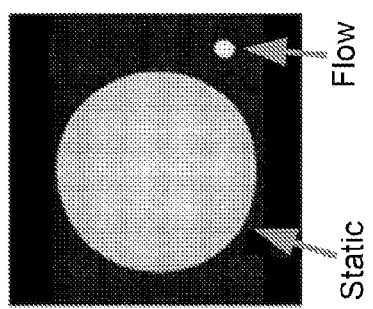
FIG. 7 shows a flow phantom.

With reference to FIGS. 7 and 8, a prototype of the LOBBI-based IBBI technique has been implemented on a flow phantom illustrated in FIG. 7. The flow phantom and a static phantom are used in this setup to demonstrate the interleaved black and bright blood imaging scheme (see FIG. 8, where the flow signal is seen to change its brightness among images). After the application of the IBBI sequence, the signal in the flow phantom alternates between the bright and black contrasts, demonstrating effective interleaving of the black and bright blood signal. No bright blood signal variation is visually detectable in the images of FIG. 8 before and after the application of the black blood imaging modules.

With reference to FIG. 9, the signal intensity (SI) of all bright blood images were quantitatively measured. FIG. 9 plots the signal measured on bright blood images. No variation is found before and after the application of black blood imaging modules, demonstrating the effectiveness of LOBBI based IBBI scheme.

While the illustrative embodiments employ TOF bright blood imaging, other types of T1 weighted (for AIF measurement) techniques may be interleaved with the LOBBI black blood sequences, such as Inversion Recovery-Turbo Field Echo (IR-TFE) or T1-weighted Turbo Spin Echo (T1-TSE) sequences.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A method comprising:
   performing a plurality of repetitions of a local excitation black blood imaging (LOBBI) sequence using a magnetic resonance scanner, wherein each repetition of the LOBBI sequence includes:
      applying a first flow sensitization gradient for in-plane flow sensitization with a 90° radio frequency pulse preceding the first flow sensitization gradient and a −90° tip-up radio frequency pulse following the first flow sensitization gradient, applying a spoiler gradient after applying the first flow sensitization gradient, applying a slice-selective radio frequency excitation pulse after applying the spoiler gradient, applying a second flow sensitization gradient for in-plane flow sensitization after applying the spoiler gradient wherein the second flow sensitization gradient has area equal to the first flow sensitization gradient but of opposite polarity, and performing a magnetic resonance readout after applying the second flow sensitization gradient and after applying the slice-selective radio frequency excitation, wherein at least a portion of the second flow sensitization gradient is applied after applying the slice-selective radio frequency excitation pulse; and between successive repetitions of performing the LOBBI sequence, performing at least one interposed repetition of a bright blood angiography sequence using the magnetic resonance scanner.

2. The method of claim 1, wherein the performing of at least one interposed repetition of a bright blood angiography sequence comprises:

performing two or more interposed repetitions of the bright blood angiography sequence between successive repetitions of performing the LOBBI sequence.

3. The method of claim 1, wherein the bright blood angiography sequence comprises a time of flight (TOF) angiography sequence.

4. The method of claim 1 further comprising:

reconstructing magnetic resonance imaging data generated by the performing of the plurality of repetitions of the LOBBI sequence to generate a corresponding plurality of black blood images; and reconstructing magnetic resonance imaging data generated by the interposed repetitions of a bright blood angiography sequence to generate corresponding bright blood images.

5. The method of claim 4 further comprising: computing an arterial input function (AIF) based on the bright blood images.

6. The method of claim 4 further comprising: generating a tissue signal variation assessment from the black blood images.

7. The method of claim 1 wherein the applying a second flow sensitization gradient after applying the spoiler gradient comprises:

applying the entire second flow sensitization gradient after applying the slice-selective radio frequency excitation pulse.

8. The method of claim 1 wherein the applying a second flow sensitization gradient after applying the spoiler gradient comprises:

applying a first portion of the second flow sensitization gradient before applying the slice-selective radio frequency excitation pulse, and applying a second portion of the second flow sensitization gradient after applying the slice-selective radio frequency excitation pulse;

wherein the first and second portions of the second flow sensitization gradient have a combined area equal to the area of the first flow sensitization gradient.

9. The method of claim 1 wherein a black blood module performs a spin echo sequence.

10. The method of claim 1 wherein a time interval between applying the slice-selective radio frequency excitation pulse and performing the magnetic resonance readout is less than or about 10 ms.

11. A non-transitory storage medium storing instructions executable by an electronic data processing device operating in conjunction with a magnetic resonance scanner controlled by the electronic data processing device to perform a method as set forth in claim 1.

12. An apparatus comprising:

a magnetic resonance scanner; and an electronic data processing device programmed to perform a method as set forth in claim 1.

* * * * *